United States Patent
Place et al.

(10) Patent No.: US 8,185,079 B2
(45) Date of Patent: May 22, 2012

(54) FREQUENCY ESTIMATION IMMUNE TO FM CLICKS

(75) Inventors: Richard Alan Place, Rochester, NY (US); Ryan Kevin Johnson, Rochester, NY (US)

(73) Assignee: General Electric Company, Schenectady, NY (US)

( * ) Notice: Subject to any disclaimer, the term of this patent is extended or adjusted under 35 U.S.C. 154(b) by 146 days.

(21) Appl. No.: 12/855,015

(22) Filed: Aug. 12, 2010

(65) Prior Publication Data

US 2012/0040634 A1 Feb. 16, 2012

(51) Int. Cl.
 H04B 1/00 (2006.01)
 H04B 15/00 (2006.01)
 H04L 27/00 (2006.01)
(52) U.S. Cl. ............... 455/296; 455/63.1; 455/67.13; 455/501; 375/324
(58) Field of Classification Search .......... 455/312, 455/557, 556.1, 575.2, 41.2, 41.1, 41.3, 67.13, 455/501, 296, 63.1, 42, 205; 381/311, 334, 381/74, 77; 375/326, 344, 322, 324, 316, 375/346; 329/315, 343, 318, 320
See application file for complete search history.

(56) References Cited

U.S. PATENT DOCUMENTS

| | | | |
|---|---|---|---|
| 3,899,740 A * | 8/1975 | Unkauf et al. ............... | 455/303 |
| 3,983,488 A | 9/1976 | Bush | |
| 4,605,904 A | 8/1986 | Hajj-Chehade | |
| 4,879,729 A | 11/1989 | Salembier et al. | |
| 5,423,085 A | 6/1995 | Lim | |
| 5,982,821 A | 11/1999 | Kingston | |
| 6,381,281 B1 * | 4/2002 | Higurashi ............... | 375/240.26 |
| 6,519,344 B1 * | 2/2003 | Yajima et al. ............... | 381/103 |
| 6,771,721 B1 | 8/2004 | Rostamy et al. | |
| 7,136,442 B2 * | 11/2006 | Budde et al. ............... | 375/355 |
| 7,482,880 B2 * | 1/2009 | Herrin et al. ............... | 331/1 A |
| 7,528,891 B2 * | 5/2009 | Miyamoto ............... | 348/723 |
| 7,542,784 B2 * | 6/2009 | Passier et al. ............... | 455/557 |
| 7,596,192 B2 * | 9/2009 | Furuya ............... | 375/345 |
| 7,615,702 B2 * | 11/2009 | Becker et al. ............... | 84/612 |
| 8,073,079 B1 * | 12/2011 | Ahmed ............... | 375/324 |
| 2008/0025439 A1 * | 1/2008 | Al-Eidan ............... | 375/334 |
| 2009/0116654 A1 * | 5/2009 | Hansen et al. ............... | 381/28 |
| 2009/0281797 A1 * | 11/2009 | Zopf et al. ............... | 704/207 |
| 2010/0002807 A1 | 1/2010 | McCune, Jr. et al. | |
| 2010/0011941 A1 * | 1/2010 | Becker et al. ............... | 84/612 |

OTHER PUBLICATIONS

EP Search Report issued in connection with corresponding EP Patent Application No. 11175907.2 filed on Jul. 29, 2011.

* cited by examiner

*Primary Examiner* — Pablo Tran
(74) *Attorney, Agent, or Firm* — GE Global Patent Operation; Catherine J. Toppin

(57) ABSTRACT

An apparatus for reducing audio clicks in frequency modulated radio system includes a receiver for receiving a frequency modulated (FM) signal, and a processor for demodulating the received signal and estimating a frequency error, wherein the processor is configured to determine phase variations of the received FM signal by comparing a phase of a first signal sample to a phase of a second signal sample, wherein the first signal sample and the second signal sample are separated in time by more than one sample.

20 Claims, 6 Drawing Sheets

FREQUENCY ESTIMATION IMMUNE TO FM CLICKS

BACKGROUND

The present disclosure generally relates to communication systems, and more particularly to estimating the frequency error on a received signal that is immune to FM clicks.

A problem that plagues almost all frequency modulated (FM) and frequency shift keyed (FSK) radio systems are the FM "clicks" and "pops" that occur at low signal levels, such as when the channel signal to noise ratio (SNR) gets to 10 dB or less. "Clicks" and "pops" are generally understood to be noise events that enhance the additive noise generated in the demodulation process. At low input signal-to-noise ratios, the resulting noise enhancements can become the dominant noise source.

Frequency demodulation is normally accomplished by comparing the phase of a signal at one instant in time to the phase of the signal at an adjacent instant. The frequency of a signal is the change in phase divided by the change in time. Modulation on the signal will push the phase back and forth. By detecting these changes, FM is demodulated. The FM signal can generally be pictured as a constant-amplitude vector that pivots up and down. Noise pushes the signal vector about, but the average location of the vector remains the same, so post-demodulation filtering can remove most of the effects of noise. However, when the signal gets weak, for example at around 10 dB SNR, there is a possibility of noise making it appear as though the vector took a 360 degree spin about the origin, which it did not. This 2-π (pi) rotation causes an impulse in the demodulated output waveform, which is generally in the form of a large pulse having a frequency content extending over a wide bandwidth including DC. Filtering the signal merely spreads the pulse out over multiple samples. At modulation indexes typical of narrowband data radios, the actual phase never moves much more than 45 degrees in a bit time. So while post-detection filtering averages out regular FM noise, click or pop-noise does not benefit from any amount of filtering. It is common for an FSK modem's performance to be surprisingly poor, even though the post detection SNR is quite good, because the pre-detection SNR is under 10 dB, resulting in clicks.

For example, in a high performance modem for narrowband UHF channels, at low bit rates, frequency error relative to the symbol rate is significant. At 4800 bits per second on a 512 megahertz (MHz) radio having a 1 ppm net frequency error between transmit and receive, the phase will move approximately 38 degrees per bit due to the frequency error alone. This error must be accounted for. One approach is to estimate the frequency error with a conventional limiter-discriminator followed by a filter to average the waveform over a few dozen bit times. However, clicks will cause an error in the frequency estimate if we try to operate below a 10 dB SNR. Since certain wireless devices with optimized forward error correction are capable of performing with channel SNR below 0 dB, it would be advantageous to keep the frequency estimation technique from limiting the sensitivity.

Another approach to minimizing FM clicks involves a phase locked loop (PLL) to demodulate the signal. By tailoring the bandwidth of the loop, one can make the loop just wide enough to demodulate the signal, but not wide enough to follow the 2-π phase change produced by a click. This is usually referred to as "threshold extension" because it permits demodulation below the usual FM threshold, around 10 dB SNR. However, a phased locked loop demodulator adds complexity to radio receiver systems that is not common in commercial and consumer electronics.

Accordingly, it would be desirable to provide a system that addresses at least some of the problems identified.

BRIEF DESCRIPTION OF THE EMBODIMENTS

As described herein, the exemplary embodiments overcome one or more of the above or other disadvantages known in the art.

One aspect of the exemplary embodiments relates to an apparatus for reducing audio clicks in a frequency modulated (FM) radio system. In one embodiment, the apparatus includes a receiver for receiving a frequency modulated (FM) signal, and a processor for demodulating the received signal and estimating a frequency error, wherein the processor is configured to determine phase variations of the received FM signal by comparing a phase of a first signal sample to a phase of a second signal sample, wherein the first signal sample and the second signal sample are separated in time by more than one sample.

In another aspect, the disclosed embodiments are directed to a method of estimating frequency error on a received frequency modulated (FM) signal that is immune to FM clicks. In one embodiment, the method includes receiving the frequency modulated signal in a receiver system, demodulating the received signal including comparing a phase of a first signal sample to a phase of a second signal sample to determine a phase error; where the first signal sample and the second signal sample are separated in time by more than one sample, and providing an estimate of the frequency error on the received signal that is immune to FM clicks.

These and other aspects and advantages of the exemplary embodiments will become apparent from the following detailed description considered in conjunction with the accompanying drawings. It is to be understood, however, that the drawings are designed solely for purposes of illustration and not as a definition of the limits of the invention, for which reference should be made to the appended claims. Moreover, the drawings are not necessarily drawn to scale and that, unless otherwise indicated, they are merely intended to conceptually illustrate the structures and procedures described herein. In addition, any suitable size, shape or type of elements or materials could be used.

DETAILED DESCRIPTION OF THE EXEMPLARY EMBODIMENTS

Figure 1:
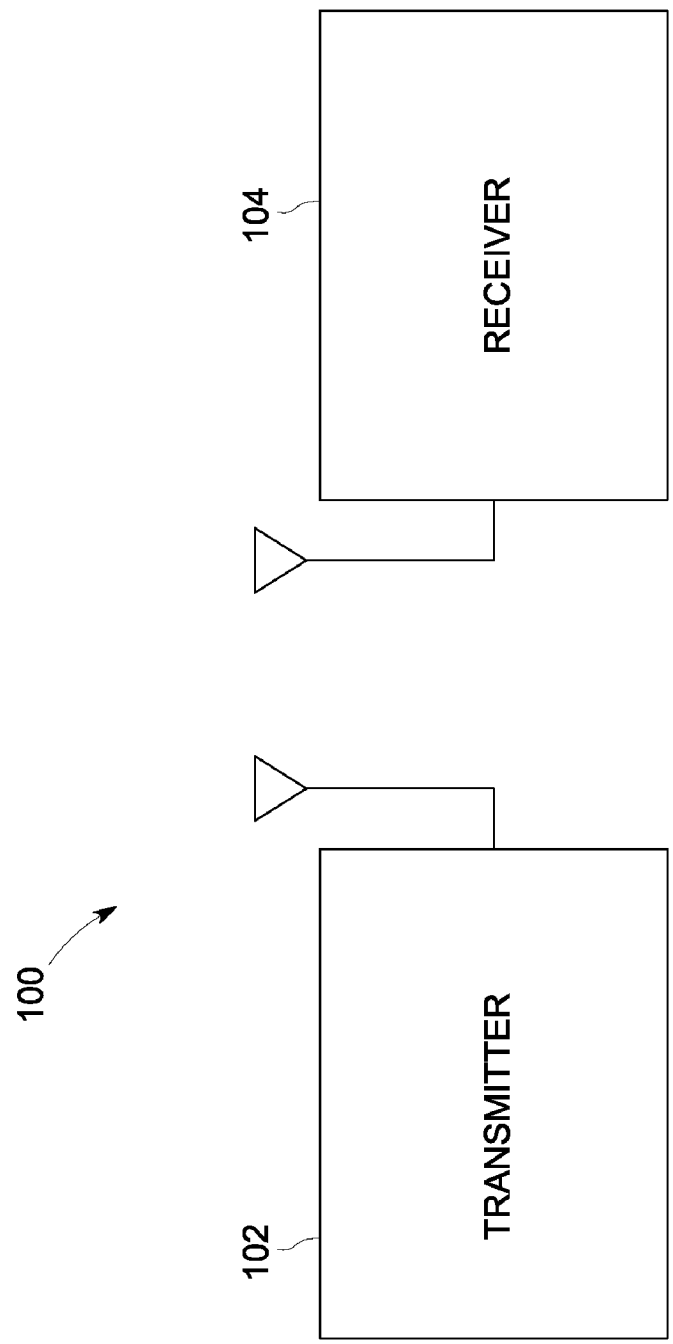
FIG. 1 is a schematic an exemplary system incorporating aspects of the disclosed embodiments.

Referring to FIG. 1, a communication system incorporating aspects of the disclosed embodiments, is generally designated by reference numeral 100. The aspects of the disclosed embodiments are generally directed to estimating frequency error on a received signal that is generally immune to the FM "clicks" and "pops" that typically limit the weak signal performance in FM and FSK systems.

The communication system 100 shown in FIG. 1 generally comprises a transmitter 102 and a receiver 104. In one embodiment, the system 100 is a wireless system that provides long distance communications of data over licensed radio bands, such as for example, radio bands in the frequency range of approximately 200 MHz to 900 MHz. In alternate embodiments, the radio system incorporating aspects of the present disclosure can be operated in any suitable radio band. One example of a communication system 100 is the Digital Energy SD series Long Range IP/Ethernet & Serial MDS SD2, MDS SD4 and MDS SD9, manufactured by GE.

As will be generally understood, the effectiveness of a receiver 104 can be limited when a transmitted signal is degraded by any one of a number of factors including for example, obstructions, interference, fading and noise. When the magnitude of a received signal becomes small, it can cause a decrease in the signal-to-noise ratio of the radio receiver. The phase variations of the received signal can generate repetitive audio disturbances, generally referred to herein as FM clicks.

Figure 2:
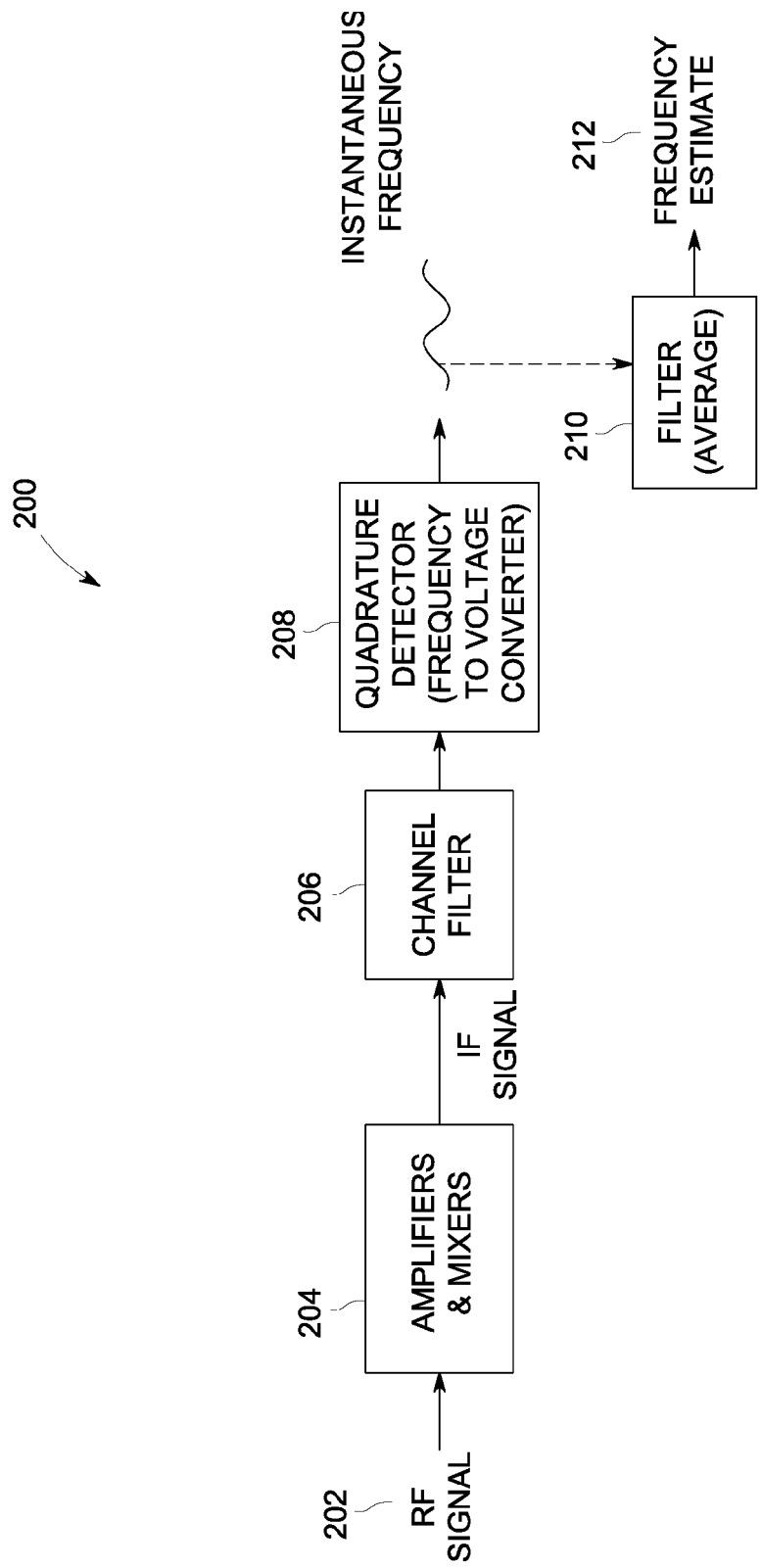
FIG. 2 is a block diagram of a prior art FM demodulation system.

Conventional analog frequency estimation systems, such as system 200 shown in FIG. 2 all suffer from a phenomena known as FM clicks whenever the signal to noise radio falls to 10 dB or less. The system 200 of FIG. 2 is one of the more common methods of frequency demodulation in an analog approach. The system 200 of FIG. 2 generally comprises amplifiers and mixers 204 for initially processing the received signal 202, as well as frequency conversion. A filter 206 passes the desired frequency while rejecting adjacent channel signals, and quadrature detector 208 can be used to recover the baseband signal. In a conventional system, the frequency error can be estimated with a conventional limiter-discriminator followed by a filter, such as filter 210 to average the waveform over a few dozen-bit times and generate the frequency estimate 212. However, if it is attempted to operate the system 200 below a signal to noise ratio of 10 dB, the resulting FM clicks will cause an error in the frequency estimate. While post detection filtering may average out regular FM noise, the FM click or pop noise does not benefit from such filtering.

In a digital system, digital data is typically transmitted in bursts, where each burst comprises a pre-defined number of data bits. While digital communication systems can improve audio quality using digital data and audio processing, the noise resulting from FM clicks may prevent the digital demodulation process entirely.

Figure 3:
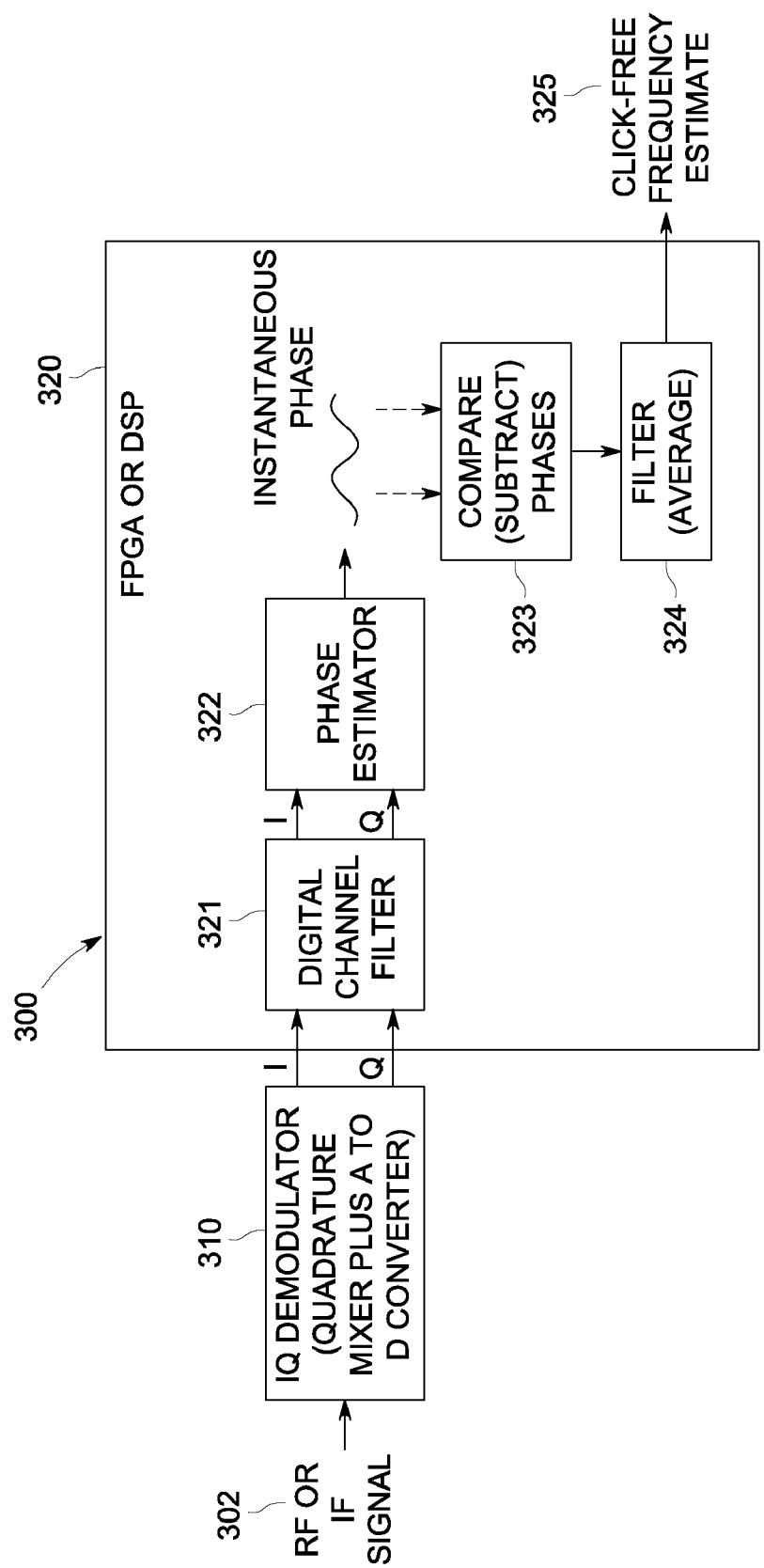
FIG. 3 is a schematic block diagram of an exemplary FM demodulation system incorporating aspects of the disclosed embodiments.

FIG. 3 illustrates one embodiment of a receiver and demodulation system 300 incorporating aspects of the disclosed embodiments. As is shown in FIG. 3, the system 300 generally includes a demodulator 310 and a processor 320. The processor 320 is generally configured to process the received signal 302 and produce a frequency estimate 325 that is free of, or essentially immune from the issue of FM clicks. The processor 320 accomplishes this by comparing the phases of signal samples that are significantly separated in time, rather than adjacent signals, to demodulate the received signal 302. In one embodiment, the processor 320 comprises a field programmable gate array (FPGA) or Digital Signal Processor (DSP) 320. In alternate embodiments, the system 300 can include other suitable components that might be typically including for performing functions and operations such as frequency conversion, filtering, rate conversion and automatic gain control. For purposes of the explanation herein, theses components are not included in the accompanying figures.

In one embodiment, the demodulator 310 shown in FIG. 3 generally comprises a quadrature demodulator that is configured to demodulate the received signal 302 to produce In-phase (I) and Quadrature (Q) baseband signals. In the embodiment shown in FIG. 3, the demodulator 310 includes a quadrature mixer and an Analog to Digital (A to D) converter. The demodulator 310 samples the received signal and a quadrature (90-degree shifted) version of the received signal. The outputs are digital representations of those two signals, typically using between 8 and 24 bits to represent the instantaneous voltage of each signal. The channel filter 321 performs a mathematical operation on the digital signals to pass the desired on-channel signal and rejects signals and noise in neighboring channels. The phase estimator 322 operates on the two signals doing what generally amounts to an Arc-Tangent lookup. From the instantaneous value of I and Q, the phase comparator 323 determines the phase of the signal.

From the phase of the signal, the frequency can be determined since the frequency is the change in phase divided by the change in time. Generally, the sample time is pre-determined based on various system requirements, and is fixed. The systems of the prior art compare each sample with the preceding sample to determine the phase change, the phase difference being proportional to the received frequency. However, unlike the systems of the prior art, the aspects of the disclosed embodiments compare each phase sample with a sample that is several time steps removed. The filter 324 averages the result. When the received signal 302 is weak, each frequency estimate made by the phase comparison has a random error in it due to noise. The filter 324 reduces these errors by averaging them out.

The processor 320 is generally configured to compare the phase of samples of the received signal 302 that are significantly separated in time from one another. Generally, the time separation between samples is large relative to the bandwidth of the received signal 302 being processed. Typically, the sampling rate of a signal is at a much smaller interval, such as twice the frequency of the signal, also referred to as the "Nyquist rate." The aspects of the disclosed embodiments utilize a sampling rate that is generally a fraction of the Nyquist rate. For example, in one embodiment, the sampling rate is approximately $\frac{1}{5}^{th}$ to $\frac{1}{10}^{th}$ the Nyquist rate. In alternate embodiments, the sampling rate can be any fraction of the Nyquist rate, other than including $\frac{1}{5}^{th}$ to $\frac{1}{10}^{th}$. Generally, the larger the time separation between samples being compared, the more immune the resulting signal 325 is from FM clicks. However, if too much time is allowed between samples being compared, it can become difficult to determine the frequency error. When there is too much time between the samples being compared, the phase can change more than 180 degrees during the time period. In one embodiment, a maximum frequency error can be determined and the maximum time between compared samples can be just less than the approximate value of (0.5/max frequency error). Generally, crystal oscillators determine the frequency accuracy of the transmitter 102 and receiver 104 in a communication system 100. The manufacturer of the oscillator specifies a maximum error over a range of temperatures. For example the GE-MDS SD series radio uses an oscillator guaranteed to be within 1 part per million from −40 to +60 degrees C. When a 500 MHz signal is transmitted, the frequency could be 500 Hz off (1 millionth of 500 MHz). The receiver could also be 500 Hz off, for a net error of up to 1000 Hz. In this case, it becomes necessary to remove the frequency error before attempting to decode the data. Knowing that the maximum frequency error is 1000 Hz, phase samples within approximately 0.5/1000=500 μsec of one another are compared. In one embodiment, the sample clock within the processor 320 operates at approximately 30.722 μsec, but using samples at that rate results in FM clicks. Instead, in accordance with the aspects of the disclosed embodiments, samples are compared that are separated by up to 500 μsec.

In one embodiment, the received signal is demodulated by taking the angle of the signal multiplied by the conjugate of a delayed sample. This allows for a comparison of the phase of the two samples.

In one embodiment, the phase of the two samples are separated by one full cycle of a preamble tone and then compared. This allows the phase change due to modulation to cancel out. For each phase comparison, the modulation vector remains substantially stationary, and any remaining phase difference is due to either frequency error or noise. By solving for frequency error using samples separated in time, the FM clicks are no longer significant.

As an example:
The received signal is 1 1 1 1 1 1 1 1 j −1 −j 1 1 1 1 1 1 1 1 1 1 1 1 1

The received signal appears to have a 360-degree phase rotation at one spot in an approximately the middle. In a conventional demodulation process, which takes the phase difference between adjacent points, the resulting demodulated signal is:

0 0 0 0 0 0 1.57 1.57 1.57 1.57 0 0 0 0 0.

When averaged over 128 samples (32 bits at 4 samples per bit), the result is 6.28/128 or 0.0491 radians per sample. This click causes a predictable error in the estimated frequency. For a 9600 bit per second (bps) 4-sample per bit radio, this represents a 300 hertz (Hz) error.

The demodulation method of the disclosed embodiments, using the phase difference between samples that are significant separated in time, in this example 16-bits apart, provides the following demodulated signal:

0 0 0 0 0 0 −1.57 3.14 1.57 0 0 0 0 0 0 0 0 0 0 0 1.57 −3.14 −1.57 0 0 0

When this sequence is averaged over 128 points the result is 0, no clicks, no error in frequency estimate.

When the 128-point average includes only half of the disturbance, the peak is +/−3.14/128 or +/1 0.0245 radians per 16 samples. This is the equivalent of +/−0.0015 radians per sample. The disturbance creates a pair of glitches, which cancel each other out. Additionally, the glitches are small because the phase change is considered to have occurred over 16 sample times, or bits, instead of one, where the phase change of adjacent samples is measured.

Figure 4:
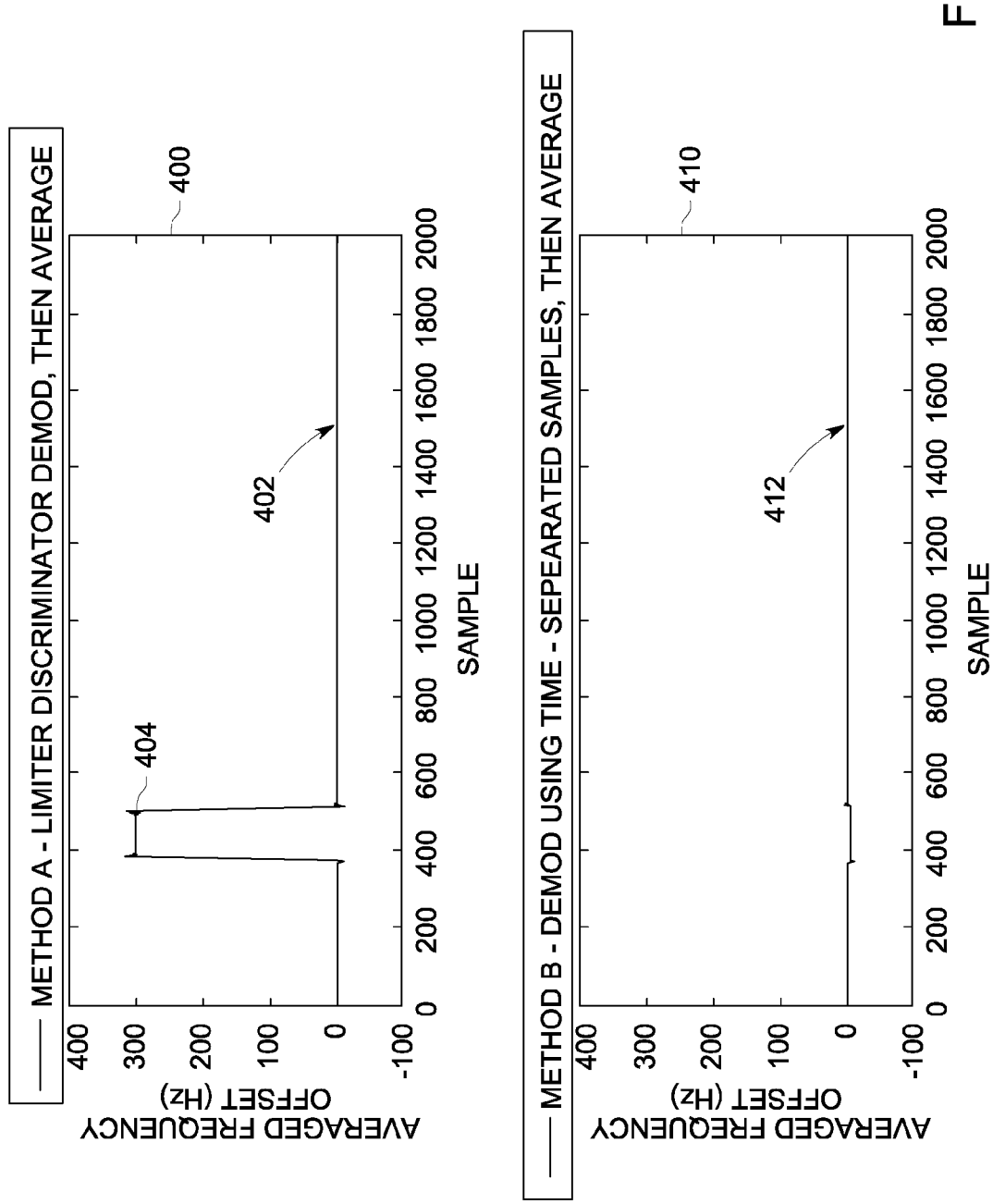
FIG. 4 illustrates a comparison of demodulated signals resulting from a conventional demodulation method and a demodulation method incorporating aspects of the disclosed embodiments.

FIG. 4 illustrates a comparison of the waveforms resulting from the demodulation of signal 302 using different modulation techniques. The top graph 400 shows the demodulated output signal waveform 402 using the conventional prior art technique of comparing the phase change of adjacent samples. The bottom graph 410 illustrates the demodulated output signal waveform 412 resulting from using the phase change of samples significantly separated in time in accordance with the aspects of the disclosed embodiments. Waveform 402 includes a frequency offset spike 404, having an amplitude of approximately 300 Hz. In contrast, waveform 412 does not include any spikes or noise clicks. Rather, the average frequency offset is approximately 0. In the example shown in the lower curve 410, the sample separation is 16 sample times. Any glitches or spikes that do occur are small due to the sample separation, and tend to cancel themselves out.

Figure 5:
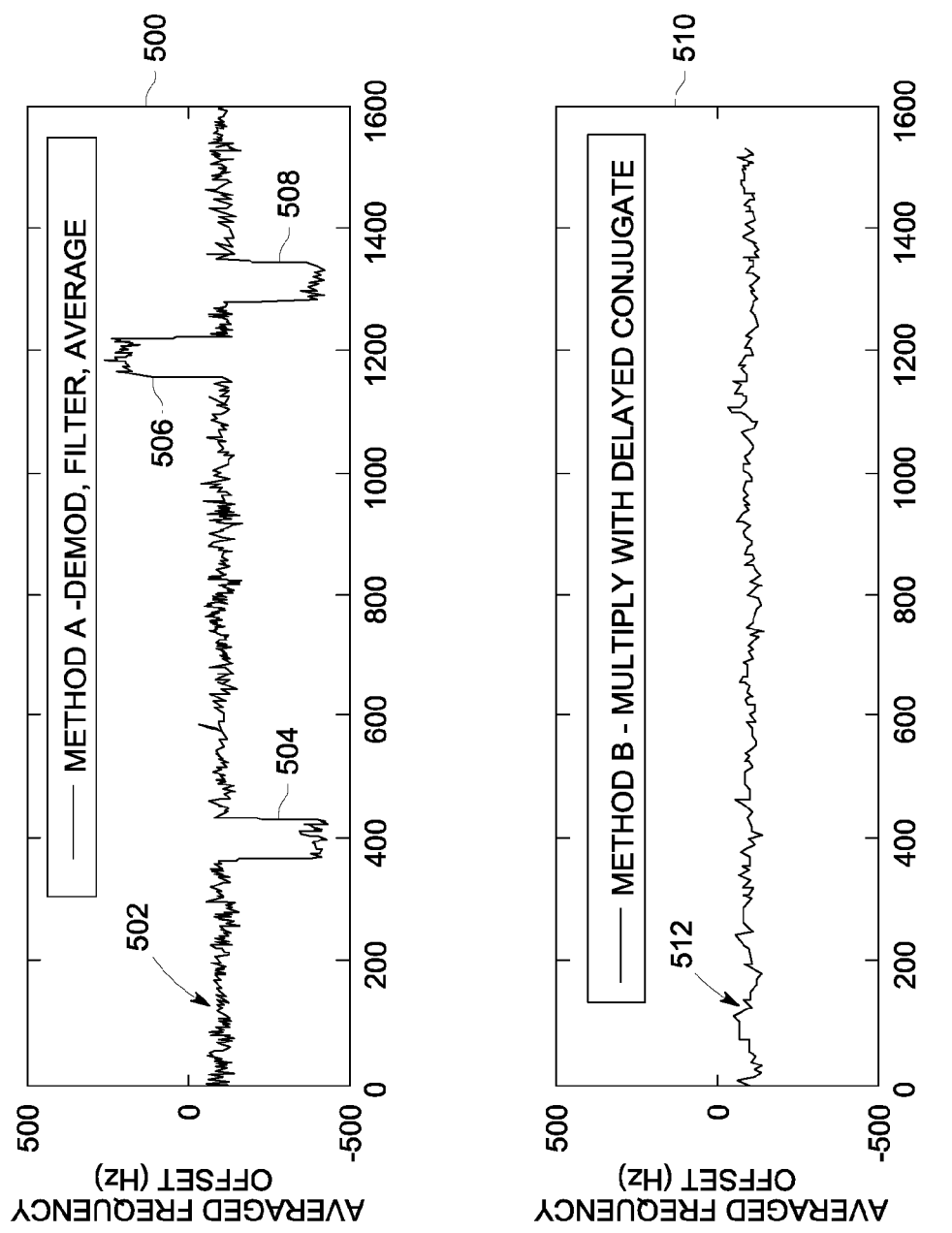
FIG. 5 illustrates a comparison of demodulated signals resulting from a conventional demodulation method and a demodulation method incorporating aspects of the disclosed embodiments.

FIG. 5 illustrates the exemplary waveforms resulting from the estimation of the frequency error of a 100 Hz off-frequency preamble signal received at 6 dB Eb/No. In this example, the upper graph 500 illustrates the waveform 502 resulting using a conventional method of determining frequency. As can be seen, the estimation results in FM clicks, shown as spikes or glitches 504, 506 and 508. The lower graph 510 illustrates the waveform 512 resulting from demodulating the received signal by measuring the phase differences of samples significantly separated in time, in accordance with the aspects of the disclosed embodiments. As is illustrated by the graph 510, using the techniques of the disclosed embodiments, the waveform 512 does not include any spikes or glitches, and is substantially immune to the FM clicks that can limit frequency estimation and radio performance at weak signal levels. Thus, the graphs of FIGS. 4 and 5 illustrate the advantages of the disclosed embodiments, since there are no pulses or clicks in either waveform 412 or 512. However, in each of waveforms 402, 502, which illustrate the result of conventional frequency estimation methods, the pulses and clicks are present.

Figure 6:
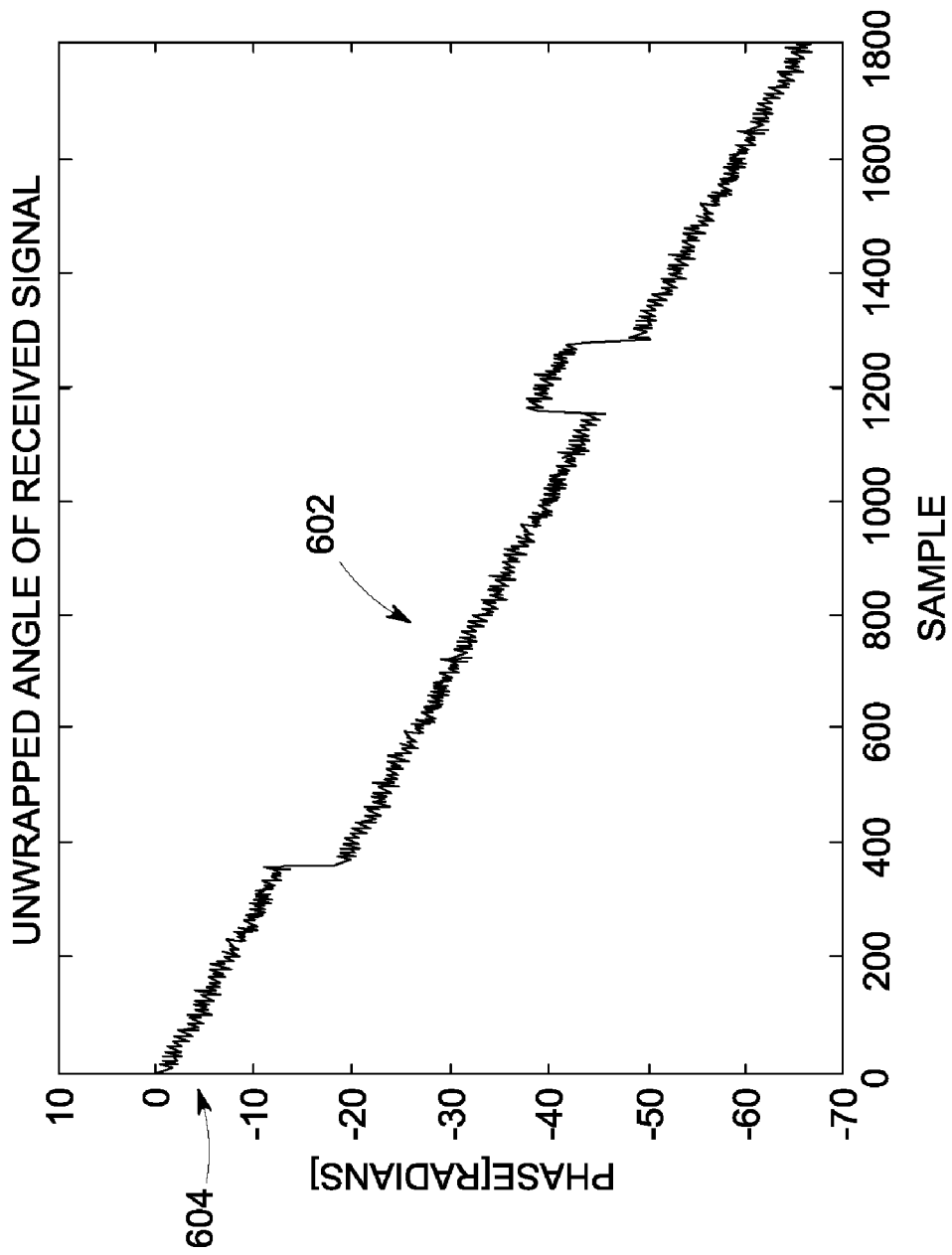
FIG. 6 is a graph illustrating the unwrapped angle of the received RF signal resulting in the waveforms shown in FIG. 5.

The graph in FIG. 6 illustrates a waveform 602 of the unwrapped angle of the RF signal that resulted in the demodulated waveforms shown in FIG. 5. In this example, the vertical axis 604 is the phase of the received signal in radians. The line of the waveform 602 is substantially diagonal because the frequency error is −100 Hz, so the phase of each sample is slightly less than the previous one. At three different instants, noise on the signal makes it appear as though the phase took a 2-π jump (6.28 radians). The prior art FM demodulation techniques produce a click in each of those occurrences, as shown by waveform 502 in graph 500, but using the system of the disclosed embodiments, the resulting demodulated signal is immune from any clicks, as shown by the waveform 512 in graph 510.

The aspects of the disclosed embodiments may also include software and computer programs incorporating the process steps and instructions described above that are executed in one or more computers. In one embodiment, one or more computing devices, such as a the FPGA 320 of FIG. 3, are generally adapted to utilize program storage devices embodying machine-readable program source code, which is adapted to cause the computing devices to perform the method steps of the present disclosure. The program storage devices incorporating features of the present disclosure may be devised, made and used as a component of a machine utilizing optics, magnetic properties and/or electronics to perform the procedures and methods of the present disclosure. In alternate embodiments, the program storage devices may include magnetic media such as a diskette or computer hard drive, which is readable and executable by a computer. In other alternate embodiments, the program storage devices could include optical disks, read-only-memory ("ROM") floppy disks and semiconductor materials and chips.

The computing devices may also include one or more processors or microprocessors for executing stored programs. The computing device may include a data storage device for the storage of information and data. The computer program or software incorporating the processes and method steps incorporating features of the present disclosure may be stored in one or more computers on an otherwise conventional program storage device.

The aspects of the disclosed embodiments are generally directed to estimating the frequency error in a demodulated FM signal. Instead of frequency demodulating the received signal by comparing the phase of the received signal at one instant of time to the phase of an adjacent instant, the aspects of the disclosed embodiments compare the phase of the received signal at one instant of time to the phase of an instant that is significantly separated in time. The separation in time can generally be a factor of the maximum frequency error, and can be defined or set to be just less than (0.5/maximum frequency error) or one-half the period of the maximum frequency error. The resulting demodulated FM signal is generally immune to FM clicks, particularly when the channel signal-to-noise ratio is 10 dB or less. The aspects of the disclosed embodiment thus provide a simple by accurate estimate of the frequency of a received signal that can be used in a high performance wireless modem, for example. Other techniques would require a stronger signal, more complexity or a much longer frequency estimation time.

Thus, while there have been shown and described and pointed out fundamental novel features of the invention as applied to the exemplary embodiments thereof, it will be understood that various omissions and substitutions and changes in the form and details of devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. An apparatus for estimating frequency error on a received frequency modulated (FM) signal that is immune to FM clicks comprising:
    a receiver for receiving a FM signal; and
    a processor for demodulating the received signal and estimating the frequency error, wherein the processor is configured to determine phase variations of the received FM signal by comparing a phase of a first signal sample to a phase of a second signal sample, wherein the first signal sample and the second signal sample are separated in time by more than one sample.

2. The apparatus of claim 1 the first signal sample and the second signal sample are not adjacent to each other.

3. The apparatus of claim 1 wherein the time separation between the first signal sample and the second signal sample is less than the Nyquist rate of the received signal.

4. The apparatus of claim 3 wherein the time separation between the first signal sample and the second signal sample is in the range of $1/5^{th}$ to $1/10^{th}$ the Nyquist rate of the received signal.

5. The apparatus of claim 1 wherein the time separation between the first signal sample and the second signal sample does not exceed a period corresponding to a maximum frequency error of the receiver.

6. The apparatus of claim 1 wherein the time separation is less than one-half of a period of the maximum frequency error.

7. The apparatus of claim 1 wherein the time separation is one full cycle of a preamble tone.

8. The apparatus of claim 1 wherein the apparatus is a frequency modulated (FM) or a frequency shift keyed (FSK) radio system.

9. The apparatus of claim 1 wherein a signal-to-noise ratio of a receiving channel is equal to or less than 10 dB.

10. The apparatus of claim 1 further comprising that the processor is configured to estimate the frequency error when a signal-to-noise level of the received signal is equal to or less than 10 dB.

11. A method of estimating frequency error on a received frequency modulated (FM) signal that is immune to FM clicks comprising:
    receiving the frequency modulated signal in a receiver system;
    demodulating the received signal including comparing a phase of a first signal sample to a phase of a second signal sample to determine a phase error; where the first signal sample and the second signal sample are separated in time by more than one sample; and
    providing an estimate of the frequency error on the received signal that is immune to FM clicks.

12. The method of claim 11 further comprising that the first signal sample and the second signal sample are not adjacent to each other.

13. The method of claim 11 wherein the time separation between the first signal sample and the second signal sample is less than a Nyquist rate of the received signal.

14. The method of claim 13 wherein the time separation between the first signal sample and the second signal sample is in the range of $1/5^{th}$ to $1/10^{th}$ the Nyquist rate of the received signal.

15. The method of claim 11 wherein the time separation between the first signal sample and the second signal sample does not exceed a period corresponding to a maximum frequency error of the receiver.

16. The method of claim 11 wherein the time separation is less than one-half of a period of the maximum frequency error.

17. The method of claim 11 wherein a signal-to-noise ratio of a receiving channel is equal to or less than 10 dB.

18. The method of claim 11 further comprising estimate the frequency error when a signal-to-noise level of the received signal is equal to or less than 10 dB.

19. The method of claim 11 wherein the time separation is one full cycle of a preamble tone.

20. The method of claim 11 wherein the receiver system is a frequency modulated (FM) or a frequency shift keyed (FSK) radio system.

* * * * *